United States Patent [19]

Chesley

[11] Patent Number: 5,651,131
[45] Date of Patent: Jul. 22, 1997

[54] REFRESHING A DYNAMIC RANDOM ACCESS MEMORY UTILIZING A MANDATORY OR OPTIONAL REFRESH

[75] Inventor: Gilman Chesley, Santa Cruz, Calif.

[73] Assignee: Sun Microsystems, Inc., Mountain View, Calif.

[21] Appl. No.: 657,533

[22] Filed: Jun. 5, 1996

Related U.S. Application Data

[63] Continuation of Ser. No. 385,197, Feb. 7, 1995, abandoned, which is a continuation of Ser. No. 809,957, Dec. 18, 1991, abandoned.

[51] Int. Cl.$^6$ ................................................. G06F 12/16
[52] U.S. Cl. ................................................. 395/433
[58] Field of Search ............................. 395/433; 365/222

[56] References Cited

U.S. PATENT DOCUMENTS

| | | | |
|---|---|---|---|
| 4,172,282 | 10/1979 | Aichelmann, Jr. et al. | 395/433 |
| 4,317,169 | 2/1982 | Panepinto, Jr. et al. | 395/433 |
| 4,406,013 | 9/1983 | Reese et al. | 365/222 |
| 4,631,701 | 12/1986 | Kappeler et al. | 395/433 |
| 4,965,722 | 10/1990 | Takuume | 395/433 |
| 5,027,327 | 6/1991 | Kobayashi et al. | 365/222 |
| 5,261,068 | 11/1993 | Gaskins et al. | 395/484 |

OTHER PUBLICATIONS

Deferred Refresh of Dynamic Random Access Memory, 2244 Research Disclosure, Oct. 1991, No. 30, p. 768.
Dynamic Ram Refresh Controller, IBM Technical Disclosure Bulletin, vol. 28, No.12, May 1986, pp. 5491–5492.

*Primary Examiner*—Eddie P. Chan
*Assistant Examiner*—Reginald G. Bragdon
*Attorney, Agent, or Firm*—Blakely, Sokoloff, Taylor & Zafman

[57] ABSTRACT

A data processing system which utilizes dynamic memory that requires periodic refreshment includes a processor coupled to a memory controller which is in turn coupled to the dynamic memory. The memory controller includes a memory operation command queue for sequentially receiving memory operation commands from the processor and a refresh module for initiating refresh operations. The refresh module includes circuitry for initiating either a mandatory refresh operation or an optional refresh operation. Mandatory refresh operations are initiated at the conclusion of periodic intervals, unless an optional refresh operation has been initiated within the particular interval. An optional refresh operation is initiated within a particular interval if the memory operation command queue is empty. Optional refresh operations thereby serve to substitute for mandatory refresh operations, minimizing the system time lost to refresh operations.

6 Claims, 3 Drawing Sheets

REFRESHING A DYNAMIC RANDOM ACCESS MEMORY UTILIZING A MANDATORY OR OPTIONAL REFRESH

This is a continuation of application Ser. No. 08/385,197 filed Feb. 7, 1995, now abandoned, which is a continuation of application Ser. No. 07/809,957 filed Dec. 18, 1991, now abandoned.

BACKGROUND OF THE INVENTION

1. Field of the Invention

This invention relates to the field of computer memories, and more particularly, to an improved method and apparatus for refreshing dynamic random access memories (DRAMs) utilized in a data processing system.

2. Art Background

Data processing systems typically utilize dynamic memories to store and retrieve data. Dynamic memories advantageously provide substantial memory capacity and low power consumption. Dynamic memories, however, must be periodically refreshed in order to preserve the data stored in the memory cells of the dynamic memory. Periodic refreshment is required because a dynamic memory cell typically consists of a single transistor and a capacitor, and the state of the memory cell is determined by the state of the charge on the capacitor, a charge which eventually degrades or leaks off the capacitor.

A dynamic random access memory ("DRAM") defines as part of its specification a refresh period indicating how frequently the DRAM must be refreshed. Such refresh periods typically range between 2 mS and 32 mS. This period of time corresponds, with some worst-case approximation, to the maximum amount of time allowed between refresh operations. A data processing system utilizing a DRAM typically employs circuitry and logic external to the DRAM to insure that these refresh operations are conducted in a timely fashion. One disadvantage of these mandatory refresh operations is that they consume valuable system time, as other operations with respect to the DRAM are necessarily stalled until the refresh operation is completed. For example, if the mandatory refresh operation takes eight clock cycles to complete, all other memory operations with respect to the DRAM are effectively stalled for these eight clock cycles. These eight clock cycles, which might potentially be used for other memory operations, are essentially lost to the mandatory refresh operation.

As will be described, the present invention provides for a data processing system with an optional refresh capability in addition to a mandatory refresh capability. With both an optional refresh capability and a mandatory refresh capability, the present invention provides for the selective use of optional refreshes to minimize the system time lost to refresh operations.

SUMMARY OF THE INVENTION

The present invention operates within a data processing system which utilizes dynamic random access memories ("DRAMs") requiring periodic refreshment. The data processing system includes a processor coupled to a system bus. A memory controller for controlling memory operations is coupled to the system bus and to a memory bus in communication with the DRAMs. The memory controller includes a memory operation command queue for sequentially receiving memory operation commands placed on the system bus, and a refresh module for initiating refresh operations. The refresh module includes circuitry for initiating either a mandatory refresh operation or an optional refresh operation. This circuitry includes a mandatory refresh counter, a refresh flip-flop, a coupling to the memory operation command queue, and refresh logic.

In the present invention, the mandatory refresh counter is initially loaded with a predetermined first value. This predetermined first value is chosen such that the period of time it takes to decrement the mandatory refresh counter down to zero corresponds to the refresh period for the DRAMs. Thus, as a general rule, the mandatory refresh counter counts down from an initial value to zero to determine when the next mandatory refresh operation should be be initiated. However, while this count is in progress, if the memory operation command queue is empty, an optional refresh operation is initiated to take advantage of this condition.

The use of an optional refresh operation avoids the need to conduct the next mandatory refresh operation. Thus, when the mandatory refresh counter reaches zero, and an optional refresh operation has been conducted during the count from the predetermined first value to zero, the ordinarily conducted mandatory refresh operation is cancelled. Instead, the mandatory refresh counter is simply loaded again with the first predetermined value, and the process of decrementing the mandatory refresh counter is repeated.

If, on the other hand, the mandatory refresh counter reaches zero, and an optional refresh operation has not been conducted during the count from the predetermined first value to zero, a mandatory refresh operation is initiated. Thereafter, the mandatory refresh counter is loaded again with the first predetermined value, and the process of decrementing the mandatory refresh counter is repeated.

BRIEF DESCRIPTION OF THE DRAWINGS

Further details are explained below with the help of the examples illustrated in the attached drawings in which.

DETAILED DESCRIPTION OF THE INVENTION

As will be described, the present invention finds application in data processing systems employing dynamic random access memory. In particular, the present invention is applicable to the data processing system described in the copending application Ser. No. 07/554,283, now U.S. Pat. No. 5,283,877 filed Jul. 17, 1990, incorporated fully herein, by reference. This application discloses an improved single in-line memory module (SIMM) employing dynamic random access memories (DRAMs) having particular application for use by a digital computer for storing and retrieving data and programs. While the present invention will be described at least partly within the context of this particular data processing system, it will be appreciated by one skilled in the art that the present invention may be used in any data processing system utilizing dynamic memory requiring refreshment.

In the following description for purposes of explanation, numerous details are set forth such as specific memory sizes, bandwidths, data paths, etc. in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 1:
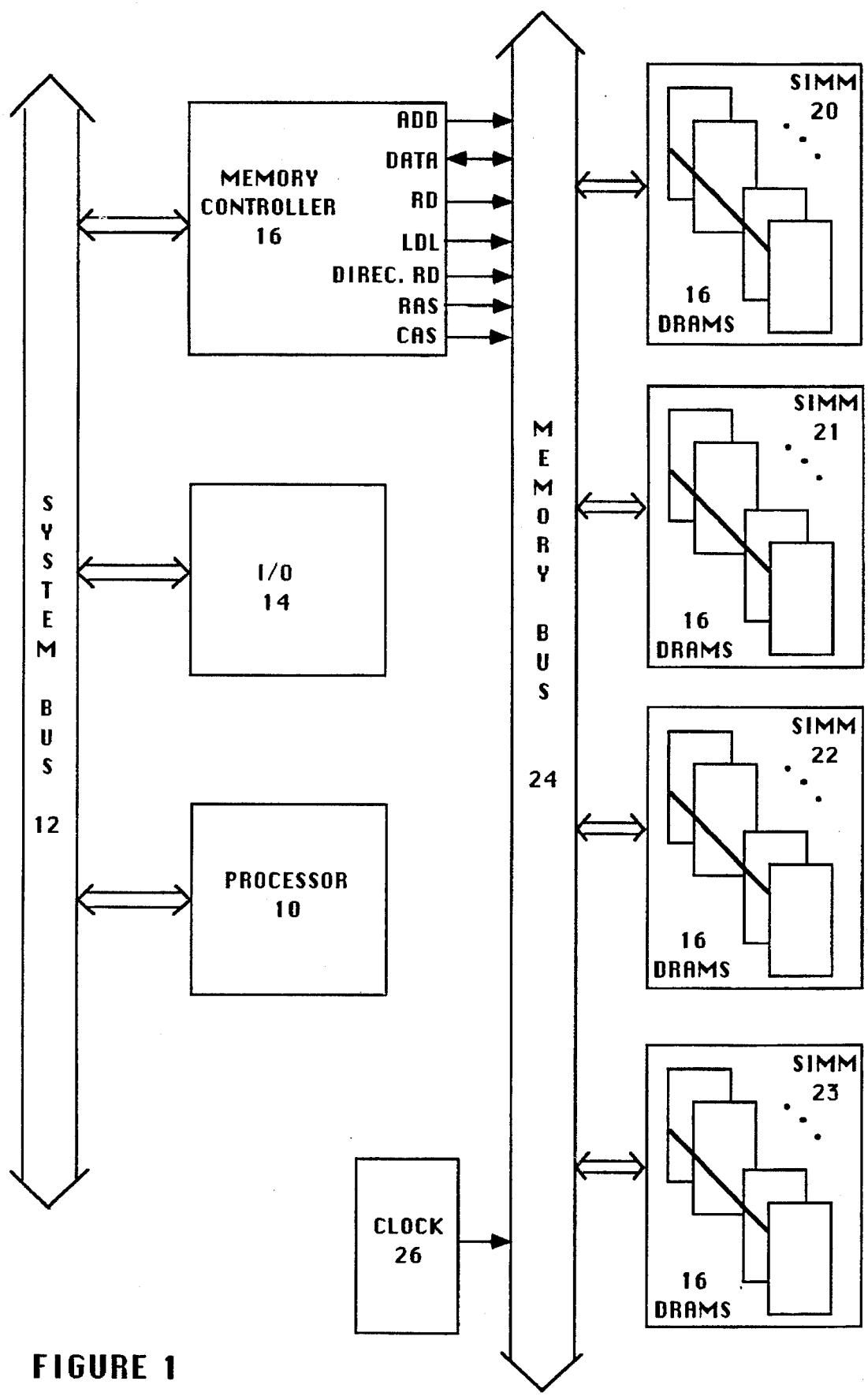
FIG. 1 is a functional block diagram of one possible data processing system employing the teachings of the present invention.

FIG. 1 illustrates one possible data processing system in which the teachings of the present invention may be utilized. A processor 10 is coupled to a system bus 12 for communicating with various system components, including input/output devices 14, and a memory controller 16. The processor 10 stores and retrieves data, which may comprise programs and/or alphanumeric and other data, in single in-line memory modules (SIMMs) 20, 21, 22, and 23. Each of these SIMMs 20–23 includes sixteen dynamic random access memories (DRAMs). As illustrated, SIMMs 20 through 23 communicate with the memory controller 16 over a memory bus 24. In addition, a clock 26 provides timed, digital clock signals over memory bus 24 to the SIMMs 20–23. Although FIG. 1 illustrates four single in-line memory modules coupled to memory bus 24, it will be appreciated by one skilled in the art that the present invention may be used in a data processing system with any number of SIMMs.

In operation, the processor 10 issues read and write commands over the system bus 12, which in turn, couples the commands to the memory controller 16. In a read operation, data is coupled from the SIMMs to the memory controller 16 over memory bus 24, and the memory controller 16 then couples the data to the system bus 12 to be read. In a write operation, data is coupled to the memory controller 16 over the system bus 12, and the memory controller 16 then couples the data to the SIMMs over the memory bus 24. Various control signals are provided by the memory controller 16 to accomplish storage of data, retrieval of data, and refreshment of the DRAMs within the SIMMs. In particular, the memory controller 16 provides row address strobes (RAS), column address strobes (CAS), and load pulses (LD_L) for the DRAMs disposed in the SIMMs, as well as other timing signals associated with the storage and retrieval of data in the SIMMs.

Figure 2:
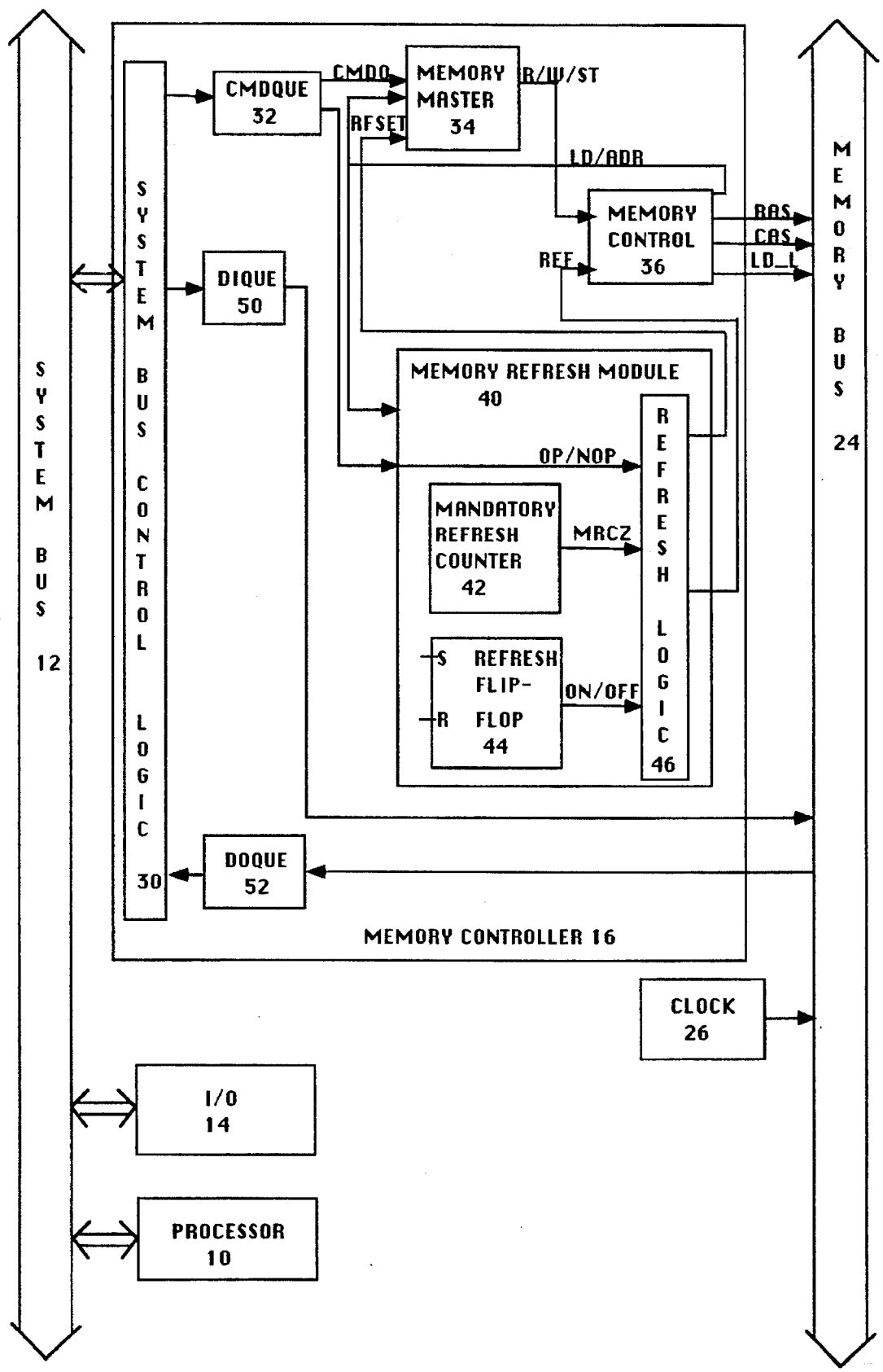
FIG. 2 is a functional block diagram of the modules and queues in the memory controller relevant to the refresh capability of the present invention.

The memory refresh system of the present invention will now be described. FIG. 2 illustrates a functional block diagram of the modules and queues in the memory controller 16 relevant to this memory refresh system. In general, system bus 12 is coupled to memory controller 16 through system bus control logic 30. In particular, memory operation commands which have been coupled to the system bus 12 are coupled to the memory controller 16 through system bus control logic 30. System bus control logic 30 couples the memory operation commands to a memory operation command queue (CMDQUE) 32. Data which has been coupled to the system bus 12 is similarly coupled through system bus control logic 30 to a data-in queue (DIQUE) 50. This data-in queue 50 is in turn coupled to the memory bus 24.

Continuing to refer to FIG. 2, a memory master module 34 embodies a state machine and is coupled to the memory operation command queue 32. The memory operation command queue 32 couples memory operation commands to the memory master module 34 which directs the memory operations corresponding to these commands. The memory master module 34 is also coupled to a memory control module 36 which provides, over memory bus 24, the timing signals, RAS, CAS, and LD_L to the DRAMS in the SIMMs. (See FIG. 1.)

As illustrated in FIG. 2, a memory refresh module 40 is coupled to both the memory master module 34 and the memory control module 36. The memory refresh module 40 determines when a refresh operation should take place, and further provides the control signals needed to initiate a refresh operation. In particular, as will be described, when the memory refresh module determines that a refresh operation should take place, the memory refresh module 40 provides two refresh control signals RFSET and REF. The memory refresh module 40 provides the RFSET signal to memory master module 34 to start a refresh cycle, and provides the REF signal to memory control module 36 to select the timing signals for the refresh operation. In the presently preferred embodiment, the memory refresh module 40 includes a mandatory refresh counter 42, a refresh flip-flop 44, a coupling to the memory operation command queue 32, and refresh logic 46. As illustrated, the mandatory refresh counter 42, the refresh flip flop 44, and the memory operation command queue are coupled to refresh logic 46.

With reference to FIGS. 1 and 2, the functioning of the memory refresh module 40 will now be described. The mandatory refresh counter 42 is initially loaded with the refresh period for the DRAMs used within the memory module or modules. This is accomplished by loading the mandatory refresh counter 42 with a first predetermined value such that the period of time it takes to decrement the mandatory refresh counter 42 with each clock cycle from the first predetermined value to a second predetermined value, corresponds to the refresh period for the DRAMs. This first predetermined value can be hard-wired in the system, or in the alternative, loaded from the processor 10. The presently preferred embodiment sets this second predetermined value to zero. However, it will be appreciated that the present invention can utilize a mandatory refresh counter 42 which decrements to any second predetermined value, or alternatively, increments to any second predetermined value.

Following the loading of the mandatory refresh counter 42, the refresh flip-flop 44 is set on. The mandatory refresh counter 42 is then decremented with each clock cycle. When the mandatory refresh counter 42 counts down to zero, an MRCZ control signal is issued and provided to the refresh logic 46. If at the time the MRCZ control signal is received by refresh logic 46, the refresh flip-flop 44 is on, the memory refresh logic 46 issues an RFSET control signal to the memory master module 34 to initiate a refresh operation, and an REF control signal to the memory control module 36 to select the timing signals for a refresh operation. The refresh operation is then conducted under the control of the memory master module 34 and the memory control module 36. Other memory operations are necessarily interrupted for the number of clock cycles it takes to complete this mandatory refresh operation.

As described, whenever the mandatory refresh counter 42 reaches zero, a determination is made as to whether a mandatory refresh operation must be initiated. It will be appreciated that a mandatory refresh operation will always take place when the mandatory refresh counter 42 reaches zero, unless the refresh flip-flop 44 is off. As will be described, the refresh flip-flop 44 is placed in an off condition whenever an optional refresh operation is conducted. It should be noted, however, that regardless of whether a mandatory refresh operation is in fact initiated, following this determination, the present invention thereafter reloads the mandatory refresh counter 42 with the first predetermined value, which in turn, sets the refresh flip-flop 44 on.

Referring again to FIG. 2, it can be seen that refresh logic 46 receives a third input in addition to the input from the mandatory refresh counter 42, and the refresh flip-flop 44. This third input arises from a coupling to the memory operation command queue 32, and indicates the status of the memory operation command queue 32. When the memory operation command queue 32 is empty, a no-operation signal (NO-OP) is coupled to refresh logic 46. When refresh logic 46 is provided with a NO-OP signal, and the refresh flip-flop 44 is in the on condition, the memory refresh logic 46 initiates what is termed an optional refresh operation. As with the mandatory refresh operation, refresh logic 46 issues an RFSET control signal to the memory master module 34 to start a refresh operation, and an REF control signal to the memory control module 36 to select the timing signals for a refresh operation.

Following an optional refresh operation, the inhibit flip-flop 44 is reset off. It will be appreciated, therefore, that following an optional refresh operation, because the refresh flip-flop 44 is thereafter in the off condition, any further optional or mandatory refresh operations are inhibited until the refresh flip-flop 44 is set on again. As described earlier, this occurs when mandatory refresh counter 42 counts down to zero, a determination is made as to whether to conduct a mandatory refresh operation, and the mandatory refresh counter is reloaded, thereby causing the refresh flip-flop 44 to be set on again.

As a general principle, the present invention utilizes optional refresh operations to effectively substitute for mandatory refresh operations whenever such substitutions result in a net savings of system time expended on refresh operations. It will be appreciated that the present invention takes advantage of what might be termed "idle time" in the data processing memory (GDC) system. The present invention uses this "idle time" to accomplish optional refresh operations. These optional refresh operations, when they occur, obviate the need to conduct the immediately succeeding mandatory refresh operation. As such, the immediately succeeding mandatory refresh operation is effectively cancelled.

It will be additionally appreciated that the savings in system time provided by the present invention depends upon a number of factors, including the number of clock cycles generally needed to complete a refresh operation, as well as the sequence, timing, and duration of NO-OP conditions. For example, if it is assumed that a refresh operation consumes 8 clock cycles, a system utilizing only mandatory refresh operations can generally be assumed to regularly interrupt and stall eight clock cycles worth of memory operations while the mandatory refresh operation is taking place. These eight clock cycles are essentially lost to the refresh operation.

In the present invention, if the NO-OP condition which triggers the optional refresh operation lasts for one clock cycle, the optional refresh operation interrupts and stalls only seven clock cycles worth of memory operations. Thus, at a minimum, every time an optional refresh operation is conducted, it can be assumed that at least one clock cycle worth of system time is being saved. On the other hand, if as is likely, the NO-OP condition which triggers the optional refresh operation lasts for a greater number of clock cycles, the system time saved is correspondingly higher. For example, if the triggering NO-OP condition lasts for eight clock cycles, the present invention conducts a refresh operation for these eight clock cycles and thereby saves eight clock cycles worth of system time. (A NO-OP condition lasting for more than eight clock cycles would still result in a savings of eight clock cycles, for the refresh operation is assumed, in this example, to last but eight clock cycles.)

Figure 3:
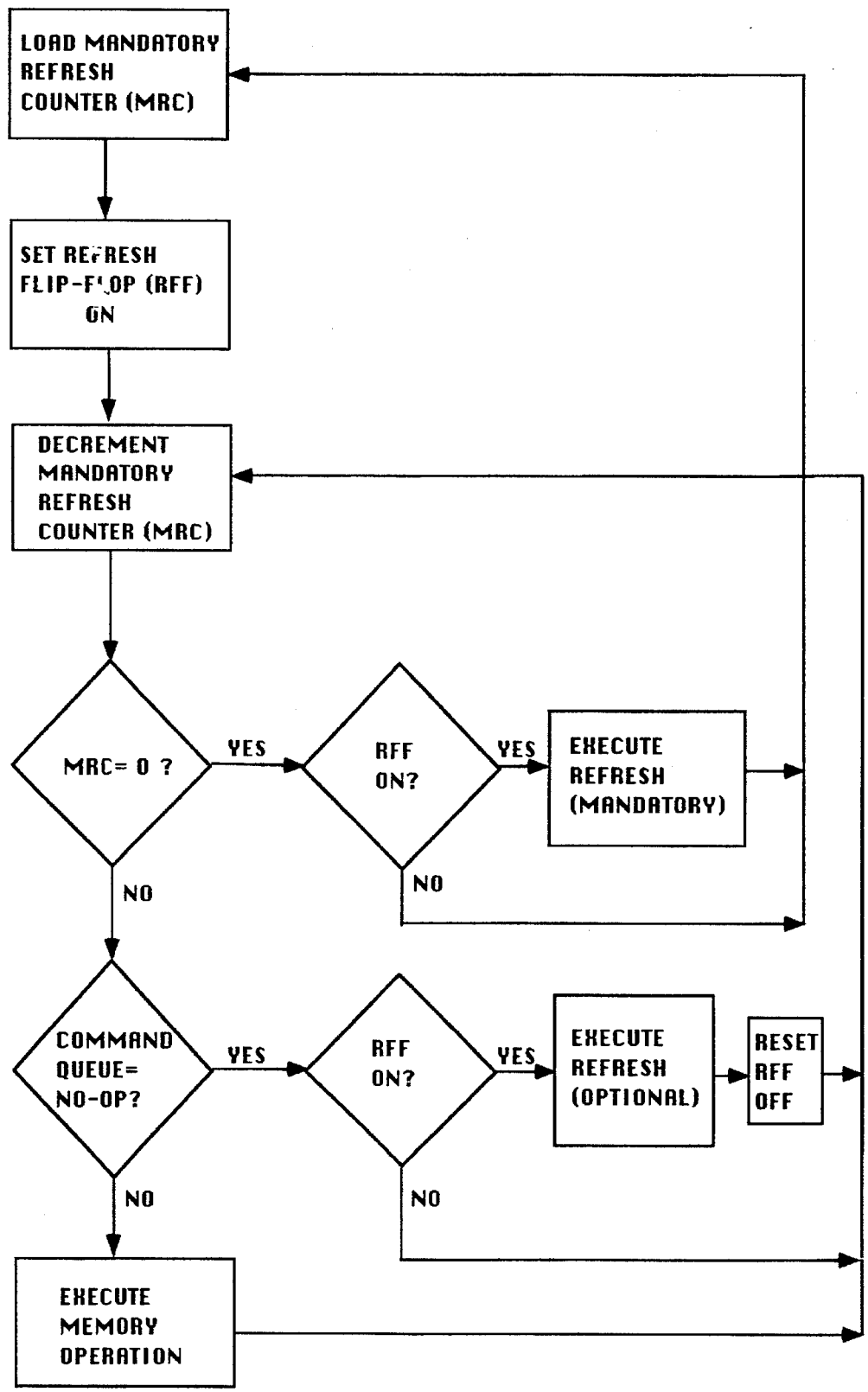
FIG. 3 is a flow chart illustrating the method of the present invention.

The method of the present invention is illustrated in further detail in the flow chart shown in FIG. 3. Referring to FIG. 3, the mandatory refresh counter (MRC) is initially loaded with the refresh count. This causes the refresh flip-flop (RFF) to be set on. The mandatory refresh counter is then decremented with each clock cycle. If the count in the mandatory refresh counter is zero, and the refresh flip flop is on, the system executes a refresh operation and returns anew to the first step wherein the mandatory refresh counter is loaded with the refresh count. This particular refresh operation corresponds to a mandatory refresh operation. If, on the other hand, the count in the mandatory refresh counter is zero, and the refresh flip-flop is off, the mandatory refresh operation is bypassed, and the system simply returns anew to the first step. This would correspond to the condition wherein an optional refresh operation had previously taken place.

Assuming the count in the mandatory refresh counter is not zero, the system determines whether an optional refresh operation should take place. If the memory operation command queue provides a NO-OP signal and the refresh flip-flop is on, a refresh operation corresponding to an optional refresh is initiated. Following the optional refresh operation, the refresh flip-flop is reset off, and the system returns to the step of decrementing the mandatory refresh counter. If, instead, the memory operation command queue provides a NO-OP signal, and the refresh flip-flop is off the system bypasses the optional refresh operation, and simply returns to the step of decrementing the mandatory refresh counter. This situation would correspond to the condition wherein an optional refresh operation had previously taken place.

If an optional refresh had occurred during the time when the mandatory refresh counter was counting down to zero, and if on the next counting down of the mandatory refresh counter to zero no other optional refresh occurs, the refresh flip-off would still be on, the system would execute a mandatory refresh upon the refresh counting down to zero on that next cycle. The time between refreshes might in this worst case exceed the refresh time required by the specifications set forth by the DRAM. However, the effect is only a minor one, since the DRAM specifications are highly conservative in their estimate of refresh time required. Thus the present invention uses this conservative refresh time to its advantage. Also, since the refreshes operate on only a group of DRAM cells during any one refresh operation, the effect on data is minimal. Thus, the advantage of reducing the total time for refreshes far outweighs any risk of data degradation.

If the count in the mandatory refresh counter is not zero, and the memory operation command queue does not provide the refresh logic with a NO-OP signal, no refresh operation need take place. Instead, the memory operation command in the memory operation command queue is simply executed without interruption, and the refresh system returns to the step of decrementing the counter.

While the present invention has been particularly described with reference to FIGS. 1 through 3 and with emphasis on certain memory system architectures, it should be understood that the figures are for illustration only and should not be taken as limitations upon the invention. In addition, it is clear that the methods and apparatus of the present invention have utility in any application wherein a data processing system utilizes dynamic memories requiring refreshment. It is contemplated that many changes and modifications may be made, by one of ordinary skill in the art, without departing from the spirit and scope of the invention as disclosed above.

I claim:

1. A data processing system with an optional refresh capability comprising:

a processor;

dynamic memory means;

memory controller means coupled to said dynamic memory means and said processor for controlling memory operations, said memory controller means including refresh means for directing that said dynamic memory means be refreshed, wherein said refresh means initiates mandatory refresh operations in the event of a first predetermined condition, and initiates optional refresh operations in the event of a second predetermined condition wherein said first predetermined condition includes the absence of an optional refresh operation having been previously initiated, during a first time interval fixed in duration wherein said second predetermined condition includes the absence of a memory operation being performed on said dynamic memory means and the absence of an optional refresh operation having been previously initiated during a second time interval less in duration than said first time interval, said refresh means including a refresh counter means for counting from a predetermined first value to a predetermined second value, wherein the time difference between the second and first value defines the duration of said first time interval; and further wherein said refresh counter means counts from a varying value to said predetermined first value, wherein the difference in time from said predetermined first value to the varying value defines the duration of the second time interval, said varying value corresponding to a time when the absence of a memory operation command being performed on on said dynamic memory means is detected, further wherein said refresh counter means is not reset but continues counting upon execution of an optional refresh.

2. The data processing system with an optional refresh capability as provided in claim 1, wherein said data processing system further comprises:

a memory bus wherein said memory controller means is coupled to said dynamic memory means over said memory bus; and a system bus wherein said memory controller is coupled to said processor over said system bus.

3. The data processing system with an optional refresh capability as provided in claim 1, wherein said dynamic memory means comprise at least one DRAM.

4. The data processing system with an optional refresh capability as provided in claim 1, wherein said first predetermined condition includes said refresh counter means reaching said predetermined second value.

5. A data processing system with an optional refresh capability comprising:

a processor;

at least one DRAM;

a memory controller coupled to said processor and said at least one DRAM for providing memory addresses, data, and control signals to said at least one DRAM, wherein said memory controller includes:

a memory operation command queue for receiving commands to perform memory operations on said at least one DRAM, said memory operation commands coupled to said memory controller from said processor;

refresh means coupled to said command queue, for directing that said at least one DRAM be refreshed, wherein said refresh means initiates mandatory refresh operations in the event of a first predetermined condition, and initiates optional refresh operations in the event of a second predetermined condition, wherein said first predetermined condition includes the absence of an optional refresh operation having been previously initiated during a first time interval fixed in duration, and wherein said second predetermined condition includes the absence of a memory operation command in said memory operation command queue and the absence of an optional refresh operation having been previously initiated during a second time interval less in duration than said first time interval further wherein said refresh means includes a mandatory refresh counter for counting from a predetermined first value to a predetermined second value and said first predetermined condition includes said mandatory refresh counter reaching said predetermined second value, the duration of said first time interval defined by the difference in time between said predetermined first value and said predetermined second value, and said second time interval defined by the difference in time from said predetermined first value to a varying value wherein said varying value corresponds to a time when the absence of a memory operation command in said memory operation command queue is detected, further wherein said mandatory refresh counter is not reset but continues counting upon execution of an optional refresh.

6. A method of refreshing dynamic memory in a data processing system comprising the steps of:

executing mandatory refresh operations at the end of a predetermined first time interval, fixed in duration, wherein said mandatory refresh operations are executed at the end of said first time interval if a first predetermined condition is satisfied, wherein said first predetermined condition includes the absence of an optional refresh operation having been previously executed during said first time interval;

executing optional refresh operations, wherein said optional refresh operations are performed at the time of a second time interval if a second predetermined condition is satisfied, wherein said second predetermined condition includes the absence of a memory operation being performed on said dynamic memory and the absence of an optional refresh operation having been previously executed during said second time interval, said second time interval less in duration than said first time interval, the end of said second time interval defined when the absence of a memory operation being performed on said dynamic memory is detected;

counting from a predetermined first value to a predetermined second value in a mandatory refresh counter, wherein said first predetermined condition includes said mandatory refresh counter reaching said predetermined second value, the duration of said first time interval defined by the difference in time between said predetermined first value and said predetermined second value, and said second time interval defined by the difference in time from said predetermined first value to a varying value wherein said varying value corresponds to a time when the absence of a memory operation being performed on said dynamic memory is detected, further wherein said mandatory refresh counter is not reset but continues counting upon execution of an optional refresh.

* * * * *